(12) United States Patent
Wahlroos et al.

(10) Patent No.: US 7,999,557 B2
(45) Date of Patent: Aug. 16, 2011

(54) METHOD FOR DETERMINING LOCATION OF PHASE-TO-EARTH FAULT

(75) Inventors: Ari Wahlroos, Vaasa (FI); Janne Altonen, Toijala (FI)

(73) Assignee: ABB Technology AG, Zurich (CH)

( * ) Notice: Subject to any disclaimer, the term of this patent is extended or adjusted under 35 U.S.C. 154(b) by 569 days.

(21) Appl. No.: 12/122,196

(22) Filed: May 16, 2008

(65) Prior Publication Data

US 2008/0297163 A1    Dec. 4, 2008

(51) Int. Cl.
 *G01R 31/08*   (2006.01)
(52) U.S. Cl. .................................. 324/522; 324/512
(58) Field of Classification Search .................. 324/522
 See application file for complete search history.

(56) References Cited

U.S. PATENT DOCUMENTS

| | | | | |
|---|---|---|---|---|
| 3,593,124 A * | 7/1971 | Cahen et al. | | 324/522 |
| 3,612,989 A * | 10/1971 | Souillard et al. | | 324/522 |
| 4,313,169 A * | 1/1982 | Takagi et al. | | 702/59 |
| 4,906,937 A * | 3/1990 | Wikstrom et al. | | 324/522 |
| 4,996,624 A * | 2/1991 | Schweitzer, III | | 361/63 |
| 5,455,776 A * | 10/1995 | Novosel | | 702/59 |
| 5,773,980 A * | 6/1998 | Yang | | 324/525 |
| 7,728,600 B2 * | 6/2010 | Wahlroos et al. | | 324/509 |
| 2004/0169518 A1 * | 9/2004 | Saha et al. | | 324/522 |
| 2006/0097728 A1 * | 5/2006 | Saha et al. | | 324/525 |
| 2008/0174316 A1 * | 7/2008 | Wahlroos et al. | | 324/522 |
| 2008/0284447 A1 * | 11/2008 | Wahlroos et al. | | 324/522 |
| 2009/0267611 A1 * | 10/2009 | Wahlroos et al. | | 324/522 |

FOREIGN PATENT DOCUMENTS

| | | |
|---|---|---|
| EP | 1 304 580 A2 | 4/2003 |
| EP | 1 724 597 A2 | 11/2006 |
| GB | 1140446 | 1/1969 |
| GB | 1 539 118 | 1/1979 |
| JP | 63-221266 A | 9/1988 |

OTHER PUBLICATIONS

Balcerak, P. et al., Improved unsynchronized two-end algorithm locating faults in power transmission lines, IEEE bologna PowerTech Conf., Jun. 23, 2003, Italy, no page numbering.*
de Morais Pereira, Carlos Eduardo, et al., Optimization Algorithm for fault location in transmission lines considering current transformers saturation, IEEE Trans. on Power Delivery, v. 20, 2, Apr. 2005, p. 603-608.*
European Search Report dated Oct. 24, 2007.
Seppo Hänninen et al., "Earth Fault Distance Computation With Fundamental Frequency Signals Based on Measurements in Substation Supply Bay", Report No. VTT Research Notes 2153, 2002, The Whole Document, XP-002454683 (cited in the attached European Search Report and on p. 1 of the specification).

* cited by examiner

*Primary Examiner* — Thomas Valone
(74) *Attorney, Agent, or Firm* — Buchanan Ingersoll & Rooney PC

(57) ABSTRACT

A method and apparatus for determining a location of a phase-to-earth fault on a three-phase electric line of an electric network, comprising determining, when the ratio of a fault current and load current has a first value, a first fault distance line which indicates an estimate of a distance of the fault from the measuring point in relation to an equivalent load distance, determining, when the ratio of the fault current and load current has a second value which differs from the first value, at least one second fault distance line, determining a distance at which the determined fault distance lines intersect when superimposed and determining the distance between the measuring point and the point of fault on the basis of the determined distance or distances of intersection.

23 Claims, 2 Drawing Sheets

US 7,999,557 B2

METHOD FOR DETERMINING LOCATION OF PHASE-TO-EARTH FAULT

FIELD OF THE INVENTION

The present invention relates to localization of single-phase earth faults in electric networks.

BACKGROUND OF THE INVENTION

Localization of earth faults is a challenging task. There are many factors which deteriorate the accuracy of a calculated fault location estimate, such as fault resistance and load. Distribution networks are especially challenging as they have specific features which further complicate and challenge fault localization algorithms. These include e.g. non-homogeneity of lines, presence of laterals and load taps.

Impedance-based fault location algorithms have become industry standard in modern microprocessor-based protection relays. The reason for their popularity is their easy implementation as they utilize the same signals as the other functions. Their performance has proven to be satisfactory in localizing short-circuit faults, but they are often not capable of localizing low current earth faults, i.e. earth faults in high impedance earthed systems. This is due to the fact that an earth fault in high impedance earthed networks differs fundamentally from a short circuit fault.

Document "Earth fault distance computation with fundamental frequency signals based on measurements in substation supply bay"; Seppo Hänninen, Mafti Lehtonen; VTT Research Notes 2153; Espoo 2002, discloses an example of a method for fault localization of single phase earth faults in unearthed, Petersen coil compensated and low-resistance grounded networks. The disclosed method is based on measurements in a substation supply bay and it cannot therefore be optimally applied to feeder bays. Based on simulation results presented in the document, the performance of the algorithm is quite modest: with 2 MVA loading and 30 ohm fault resistance, the maximum error in 30 km line is −6.25 km i.e. −21%. With actual disturbance recordings one could expect even larger errors.

Prior art fault localization algorithms are typically based on an assumption that load is tapped to the end point of the electric line (e.g. a feeder), i.e. the fault is always assumed to be located in front of the load point. In real medium voltage feeders this assumption is rarely correct. In fact, due to voltage drop considerations, loads are typically located either at the beginning of the feeder or distributed more or less randomly over the entire feeder length. In such cases, the accuracy of prior art fault localization algorithms is impaired.

BRIEF DESCRIPTION OF THE INVENTION

An object of the present invention is to provide a method and an apparatus for implementing the method so as to overcome the above problems or at least to alleviate the problems. The objects of the invention are achieved by a method, a computer program product and an apparatus which are characterized by what is stated in the independent claims. The preferred embodiments of the invention are disclosed in the dependent claims.

The invention is based on the idea of determining the distance to a fault based on a voltage drop profile of the electric line and utilizing a concept of equivalent load distance which refers to a distance of an equivalent load point from the measuring point which equivalent load point equals to a total load of the electric line modelled to be concentrated in a single point of the electric line.

An advantage of the invention is that the accuracy of fault localization can be improved. More accurate fault location can be obtained due to realistic modeling of the loading of the electric line. In addition, the invention provides for an improved tolerance for load current.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

The application of the invention is not limited to any specific system, but it can be used in connection with various three-phase electric systems to determine a location of a phase-to-earth fault on a three-phase electric line of an electric network. The electric line can be a feeder, for example, and may be an overhead-line or a cable or a combination of both. The electric power system in which the invention is implemented can be an electric transmission or distribution network or a component thereof, for example, and may comprise several feeders. Moreover, the use of the invention is not limited to systems employing 50-Hz or 60-Hz fundamental frequencies or to any specific voltage level.

Figure 1:
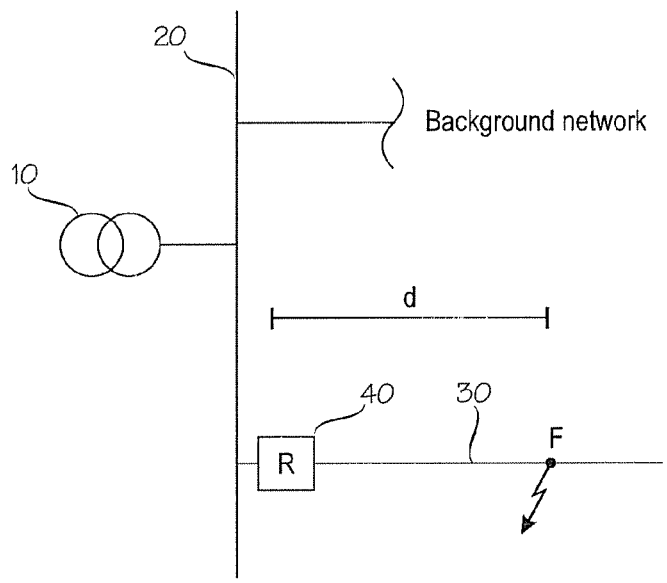
FIG. 1 is a diagram illustrating an electric network in which the invention can be used.

FIG. 1 is a simplified diagram illustrating an electric network in which the invention can be applied. The figure shows only the components necessary for understanding the invention. The exemplary network can be a medium voltage (e.g. 20 kV) distribution network fed through a substation comprising a transformer 10 and a busbar 20. The illustrated network also comprises electric line outlets, i.e. feeders, of which one 30 is shown separately. Other possible feeders as well as other network parts, except the line 30, are referred to as a 'background network'. The figure also shows a protective relay unit 40 at the beginning of line 30, and a point of earth fault F. The protective relay unit 40 may be located inside the substation. It should be noted that there may be any number of feeders or other network elements in the network. There may also be several feeding substations. Further, the invention can be utilized with a switching station without a transformer 10, for example. The network is a three-phase network although, for the sake of clarity, the phases are not shown in the figure. In the exemplary system of FIG. 1, the functionality of the invention can be located in the relay unit 40. It is also possible that only some measurements are performed at the location of unit 40 and the results are then transmitted to another unit or units in another location for further processing. In other words, unit 40 could be a mere measuring unit.

In the following, the three phases of the three-phase electricity system in which the invention is used are referred to as L1, L2, and L3. Monitored current and voltage values are preferably obtained by a suitable measuring arrangement including e.g. current and voltage transducers (not shown in the figures) connected to the phases of the electricity system. In most of the existing protection systems, these values are readily available and thus the implementation of the invention does not necessarily require any separate measuring arrangements. How these values are obtained is of no relevance to the basic idea of the invention and depends on the particular electricity system to be monitored. A phase-to-earth fault F on the three-phase electric line 30 and the corresponding faulted phase L1, L2, or L3 of the three-phase electric line of the electricity system to be monitored may be detected by e.g. a protective relay 40 associated with the electricity system. The particular way how the phase-to-earth fault is detected and the corresponding faulted phase is identified is of no relevance to the basic idea of the invention.

The invention utilizes a concept of equivalent load distance of the electric line. For the sake of brevity, the equivalent load distance is referred to as ELD in the following. The concept of ELD, or parameter s, indicates a distance of an equivalent load point from the measuring point, which equivalent load point equals to a total load of the electric line modelled to be concentrated in a single point of the electric line. In other words, the loading of the electric line is taken into account by modelling it and the loading is preferably modelled with a fictitious single load tap located at distance s [0 . . . 1 p.u.] from the measuring point. Parameter s represents this ELD, which can be determined either by means of calculations or by means of measurements in primary network, as will be shown below in more detail.

Figure 2:
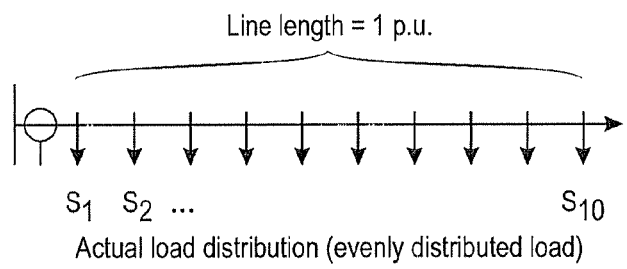
FIG. 2 illustrates derivation of equivalent load distance according to an embodiment.
Figure 2:
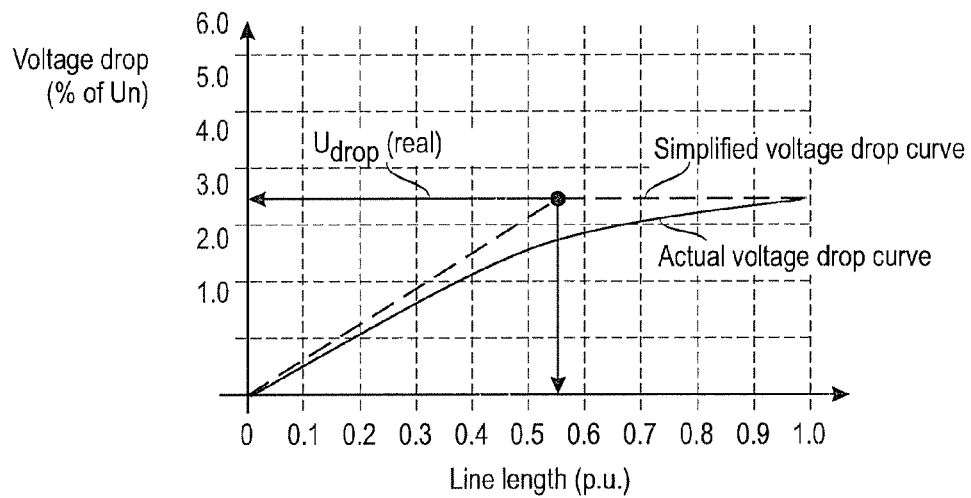
Figure 2:
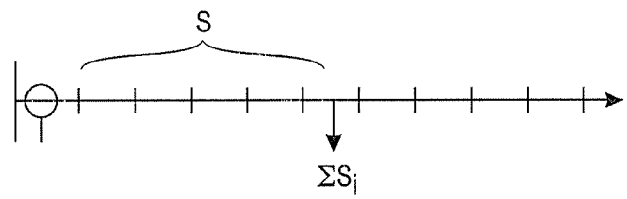

FIG. 2 further visualizes the derivation and meaning of parameter s. In the illustrated exemplary case, the load is assumed to be evenly distributed along the electric line. In FIG. 2, the solid curve shows the actual voltage drop. The maximum value of the voltage drop is experienced at the end of the line and it is denoted by $U_{drop(real)}$. Now, if the whole load of this line were concentrated as a single load tap and located at distance s from the substation, the resulting maximum voltage drop would equal the actual maximum voltage drop $U_{drop(real)}$. The dashed curve in FIG. 2 shows the voltage drop when the total load is concentrated in a single load tap and located at distance s from the measuring point.

Figure 3:
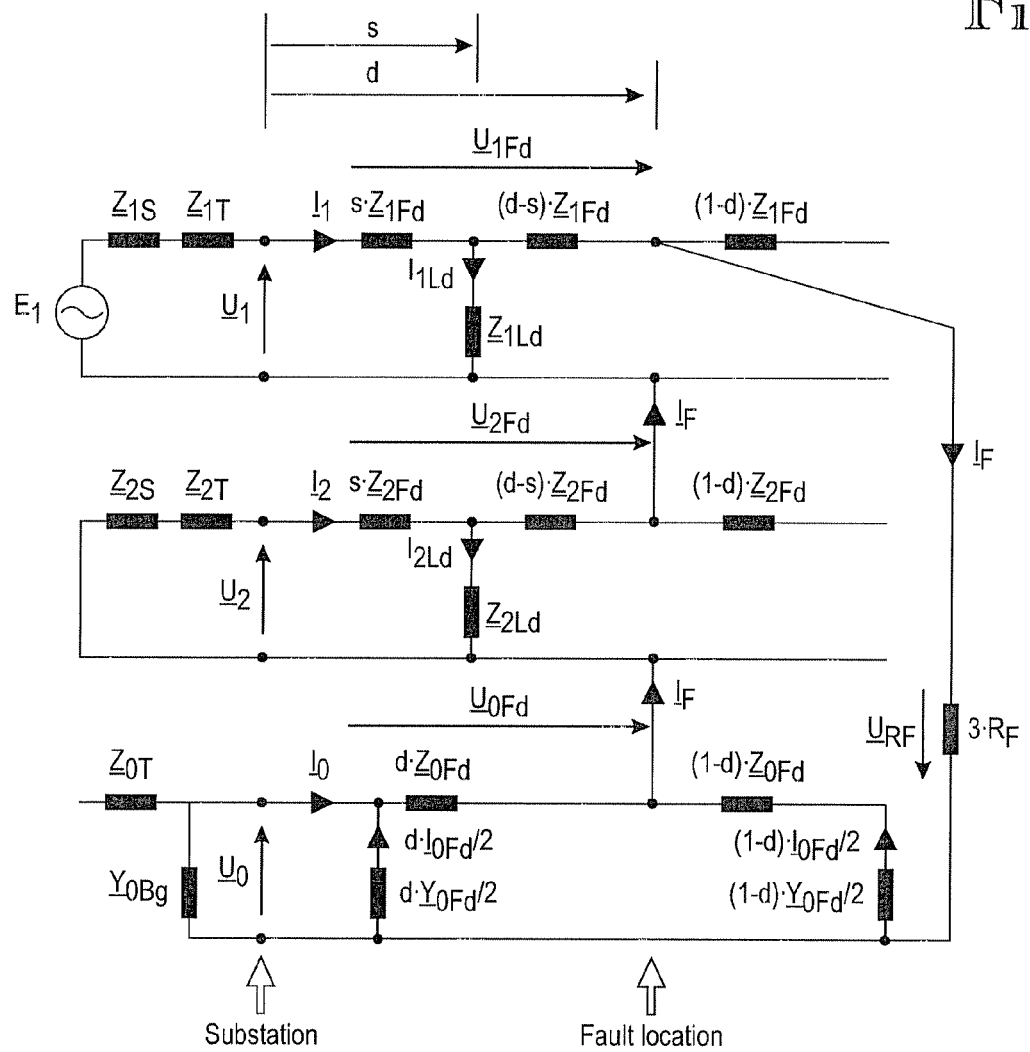
FIG. 3 is a symmetrical component equivalent scheme for single-phase earth fault on an electric line.

FIG. 3 illustrates a symmetrical component equivalent circuit for a single phase-to-earth fault, where load is located at distance s from the measuring point (substation in the example) and fault is located at distance d from the measuring point. Notations used in FIG. 3:

$Z_{1S}$=Positive sequence source impedance.
$Z_{1T}$=Positive sequence impedance of the main transformer.
d=Per unit fault distance (d=0 . . . 1)
s=Per unit distance of the equivalent load tap.
$Z_{1Fd}$=Positive sequence impedance of the electric line per phase.
$Z_{1Ld}$=Positive sequence impedance of the load per phase.
$Z_{2S}$=Negative sequence source impedance.
$Z_{2T}$=Negative sequence impedance of the main transformer.
$Z_{2Fd}$=Negative sequence impedance of the electric line per phase.
$Z_{2Ld}$=Negative sequence impedance of the load per phase.
$Z_{0T}$=Zero sequence impedance of the main transformer.
$Y_{0BG}$=Phase-to-earth admittance of the background network per phase.
$Z_{0Fd}$=Zero sequence impedance of the electric line per phase.
$Y_{0Fd}$=Phase-to-earth admittance of the electric line per phase.
$R_F$=Fault resistance.
$I_1$=Positive sequence current measured at the measuring point.
$I_{1Ld}$=Positive sequence load current.

$I_F$=Fault component current at fault location.
$I_2$=Negative sequence current measured at the measuring point.
$I_{2Ld}$=Negative sequence load current.
$I_0$=Zero sequence current measured at the measuring point.
$I_{0Fd}$=Zero sequence charging current of the electric line itself.
$U_1$=Positive sequence voltage measured at the measuring point.
$U_2$=Negative sequence voltage measured at the measuring point.
$U_0$=Zero sequence voltage measured at the measuring point.

Based on the equivalent scheme illustrated in FIG. 3, the following equation can be written ($U_L$=faulted phase voltage):

$$U_0+U_1+U_2=U_L=U_{0Fd}+U_{1Fd}+U_{2Fd}+U_{RF}=s\cdot Z_{1Fd}\\ I_1+(d-s)\cdot Z_{1Fd}I_F+s\cdot Z_{2Fd}I_2+(d-s)\cdot Z_{2Fd}I_F+d\cdot Z_{0Fd}\cdot(\\ I_0+d\cdot I_{0Fd}/2)+3\cdot R_F\cdot I_F \quad (\text{Eq. 1})$$

After a fault occurs on the three-phase electric line, the fault distance calculation proceeds by determining, when the ratio of a fault current and load current has a first value, a first fault distance line which indicates an estimate of a distance of the fault from the measuring point in relation to an equivalent load distance on the basis of values of the monitored current and voltage quantities and an equation which relates the monitored current and voltage quantities to the fault distance. The fault distance line is preferably determined as follows:

The co-ordinates for the fault distance line representing the fault location estimate are preferably derived from Eq. 1 by inserting: s=0 (the equivalent load tap is located at the beginning of the feeder at distance 0.0 p.u.) and s=1 (the equivalent load tap is located in the end of the feeder at distance 1.0 p.u.). The fault location estimate can be calculated assuming either, that the term $I_{0Fd}/2$ in Eq. 1 is dependent on or independent of d:

Assuming, that the term $I_{0Fd}/2$ in Eq. 1 is dependent on d:

$$A = re(Z_{0Fd}*I_{0Fd})*im(I_F)+im(Z_{0Fd}*I_{0Fd})*re(I_F)$$

$$B = (-2*re(Z_{2Fd}*I_F)*im(I_F)-2*re(Z_{0Fd}*I_0)*im(\\ I_F)+2*im(Z_{0Fd}*I_0)*re(I_F)-2*im(I_F)*re(Z_{1Fd}*\\ I_F)+2*re(I_F)*im(Z_{1Fd}*I_F)+2*im(Z_{2Fd}*I_F)*re(I_F)$$

$$C = 2*im(I_F)*re(U_L)-2*re(I_F)*im(U_L)$$

$$d1(s=0)=(-B+\sqrt{B*B-4*A*C})/(2*A) \quad (\text{Eq. 3a})$$

$$d2(s=0)=(-B-\sqrt{B*B-4*A*C})/(2*A) \quad (\text{Eq. 3b})$$

The valid estimate value for fault distance d(s=0) is either d1 or d2, such that 0<d(s=0)<1 (in practice some error margin may be needed).

$$A = -im(I_F)*re(Z_{0Fd}*I_{0Fd})+im(Z_{0Fd}*I_{0Fd})*re(I_F)$$

$$B = -2*im(I_F)*re(Z_{0Fd}*I_0)+2*re(I_F)*im(Z_{1Fd}*\\ I_F)+2*re(I_F)*im(Z_{0Fd}*I_0)-2*im(I_F)*re(Z_{2Fd}*\\ I_F)+2*im(Z_{2Fd}*I_F)*re(I_F)-2*im(Z_{1Fd}*I_F)$$

$$C = 2*im(I_F)*re(U_L)-2*im(I_F)*re(Z_{1Fd}*\\ I_1)-2*im(Z_{2Fd}*I_F)*re(I_F)+2*im(I_F)*re(Z_{1Fd}*\\ I_F)-2*im(I_F)*re(Z_{1Fd}*I_2)-2*re(I_F)*im(\\ U_L)+2*im(I_F)*re(Z_{2Fd}*I_F)-2*re(I_F)*im(Z_{1Fd}*\\ I_F)+2*im(Z_{2Fd}*I_2)*re(I_F)+2*im(Z_{1Fd}*I_1)*re(I_F)$$

$$d1(s=1)=(-B+\sqrt{B*B-4*A*C})/(2*A) \quad (\text{Eq. 4a})$$

$$d2(s=1)=(-B-\sqrt{B*B-4*A*C})/(2*A) \quad (\text{Eq. 4b})$$

The valid estimate value for fault distance d(s=1) is either d1 or d2, such that 0<d(s=1)<1 (in practice some error margin may be needed).

Alternatively, assuming that the term $\underline{I}_{0Fd}/2$ in Eq. 1 is independent of d:

$$d(s=0)=2*(-1*re(\underline{I}_F)*im(\underline{U}_L)+im(\underline{I}_F)*re(\underline{U}_L))/(-2*re(\overline{F})*im(\overline{Z_{1Fd}}*\underline{I}_F)-2*re(\underline{I}_F)*im(\underline{Z}_{2Fd}*\underline{I}_F)-2*re(\underline{I}_F)*im(\underline{Z}_{0Fd}*\overline{I_0})-1*re(\underline{I}_F)*im(\underline{Z}_{0Fd}*\underline{I}_{0Fd})+2*\overline{im}(\underline{I}_F)*re(\underline{Z_{1Fd}}*\underline{I}_F)+2*\overline{im}(\underline{I}_F)*re(\underline{Z}_{2Fd}*\underline{I}_F)+2*im(\underline{I}_F)*re(\underline{Z}_{0Fd}*\underline{I}_0)+im(\underline{I}_F)*re(\underline{Z}_{0Fd}*\underline{I}_{0Fd})$$  (Eq. 5)

$$d(s=1)=-2*(re(\underline{I}_F)*im(\underline{U}_L)-1*re(\underline{I}_F)*im(\underline{Z}_{1Fd}*\underline{I}_1)-1*im(\underline{I}_F)*re(\overline{Z_{2Fd}}*\underline{I}_F)+re(\underline{I}_F)*im(\underline{Z}_{1Fd}*\underline{I}_F)-1*re(\underline{I}_F)*im(\underline{Z}_{2Fd}*\underline{I}_2)-1*\overline{im}(\underline{I}_F)*re(\underline{U}_L)+re(\underline{I}_F)*im(\underline{Z}_{2Fd}*\underline{I}_F)-1*\overline{im}(\underline{I}_F)*re(\underline{Z}_{1Fd}*\underline{I}_F)+im(\underline{I}_F)*re(\underline{Z}_{2Fd}*\underline{I}_2)+im(\underline{I}_F)*re(\underline{Z}_{1Fd}*\underline{I}_1))/(-2*re(\underline{I}_F)*im(\underline{Z}_{1Fd}*\underline{I}_F)-2*\overline{re}(\underline{I}_F)*im(\underline{Z}_{2Fd}*\underline{I}_F)-2*re(\underline{I}_F)*im(\underline{Z}_{0Fd}*\overline{I_0})-1*re(\underline{I}_F)*im(\underline{Z}_{0Fd}*\underline{I}_{0Fd})+2*im(\underline{I}_F)*re(\underline{Z}_{1Fd}*\underline{I}_F)+2*im(\underline{I}_F)*re(\underline{Z}_{2Fd}*\underline{I}_F)+2*im(\underline{I}_F)*re(\underline{Z}_{0Fd}*\overline{I_0})+im(\underline{I}_F)*re(\underline{Z}_{0Fd}*\underline{I}_{0Fd})$$  (Eq. 6)

According to an embodiment of the invention, current and voltage variables are preferably selected as follows:

$U_L$=faulted phase voltage
$\underline{I}_1$=positive sequence current component
  $=(\underline{I}_{L1}+a \cdot \underline{I}_{L2}+a^2 \cdot \underline{I}_{L3})/3$
$\underline{I}_2$=negative sequence current component
  $=(\underline{I}_{L1}+a^2 \cdot \underline{I}_{L2}+a \cdot \underline{I}_{L3})/3$
$\underline{I}_0$=zero sequence current component=$(\underline{I}_{L1}+\underline{I}_{L2}+\underline{I}_{L3})/3$
$\underline{I}_F=K_1 \cdot \underline{I}_0$ or alternatively $\underline{I}_F=\underline{I}_2$
$\underline{I}_{0Fd}=(K_1-1) \cdot \underline{I}_0$ or alternatively $\underline{I}_{Fd0}=(\underline{I}_2-\underline{I}_0)$
where
$a=\cos(120°)+j \cdot \sin(120°)$
$K_1$=current distribution factor.

The current distribution factor $K_1$ can be calculated with the following equation:

$$K_1 = \frac{Y_{0F} + Y_{0BG}}{Y_{0BG}} = \frac{Y_{0TOT}}{Y_{0BG}}$$  (Eq. 7)

where
$Y_{0F}$=Apparent zero-sequence admittance of the electric line
$Y_{0BG}$=Apparent zero-sequence admittance of the background network.

$Y_{0F}$ can be determined using predetermined conductor data:

$$\underline{Y}_{0F} = \frac{1}{R_{L0F}} + j \cdot \omega \cdot C_{0F} = \frac{1}{R_{L0F}} + j \cdot \frac{1}{X_{C0F}},$$  (Eq. 8)

where
$R_{L0F}$=Resistance representing the leakage losses of the electric line
$X_{C0F}$=Phase-to-earth capacitive reactance of the electric line Parameter $X_{C0F}$ can be calculated based on phase-to-earth capacitances of the electric line:

$$X_{C0F} = \frac{1}{j \cdot \omega \cdot C_{0F}},$$

where $C_{0F}$=total phase-to-earth capacitance per phase of the electric line.

If the magnitude of the earth fault current of the electric line $I_{ef}$ is known, the corresponding earth capacitance per phase can be calculated using equation:

$$C_{0F} = \frac{I_{ef}}{3 \cdot \omega \cdot U_V},$$

where $U_V$=magnitude of phase-to-ground voltage

The exact value for parameter $R_{L0F}$ is typically unknown, but based on field recordings, an approximation of 10 . . . 30·$X_{C0F}$ can be used. As $Y_{0F}$ is always dominantly capacitive, the knowledge of exact value of $R_{L0F}$ is not essential.

Alternatively, the value of $Y_{0F}$ can be determined by measurements:

$$\underline{Y}_{0F} = \frac{\Delta \underline{I}_0}{\Delta \underline{U}_0}$$  (Eq. 9)

where
$\Delta \underline{I}_0=(\underline{I}_{0fault}-\underline{I}_{prefault})$=a delta quantity for a measured zero sequence current component at the measuring point
$\Delta \underline{U}_0=(\underline{U}_{0fault}-\underline{U}_{prefault})$=a delta quantity for a measured zero sequence voltage component at the measuring point The measurement of (eq. 9) can be conducted whenever an earth fault occurs outside the electric line. Note, however, that the calculated values match the current switching state of the feeder and thus if the switching state of the protected feeder changes, then the values are no longer valid. In this case, the measurement should preferably be repeated.

The value for $Y_{0BG}$ can be determined by using the measured zero sequence quantities during a single-phase earth fault on the electric line:

$$\underline{Y}_{0BG} = -\frac{\Delta \underline{I}_0}{\Delta \underline{U}_0}$$  (Eq. 10)

The value of $Y_{0BG}$ describes the properties of the background network. The reactive part is proportional to the magnitude of fault current and the resistive part describes the magnitude of resistive leakage losses.

As steady-state asymmetry in zero sequence current is typically negligible, delta quantity is not absolutely required with zero sequence current in equations (Eq. 9) and (Eq. 10). However, the unbalance in phase-to-earth capacitances of individual phases creates steady-state zero-sequence voltage, which should be eliminated by using delta quantities in high impedance earthed networks.

The fault distance is preferably determined based on prefault and fault values of voltages and currents. The use of such delta-quantities is not crucial, however. The voltages and currents are preferably selected as follows:

$\underline{U}_1=\underline{U}_1$ $\underline{U}_2=\underline{U}_2$ $\underline{U}_0=\underline{U}_0$ $\underline{I}_1=\underline{I}_1$ $\underline{I}_2 = \Delta \underline{I}_2$ $\underline{I}_2 = \Delta \underline{I}_2$ $\underline{I}_0 = \Delta \underline{I}_0$ $\underline{I}_F = \Delta \underline{I}_F$ where Δ=pre-fault value−fault value.

As steady-state asymmetry in the zero sequence current is typically negligible, delta quantity is not absolutely required with zero current. Also the negative sequence current quantity could be calculated without delta quantity, especially if steady-state negative sequence current is small (i.e. load is not greatly unbalanced). Thus, quantities $\Delta \underline{I}_0$ and/or $\Delta \underline{I}_2$ could be replaced with $\underline{I}_0$ and/or $\underline{I}_2$, respectively.

The previous equations assumed an earth fault condition in phase L1. If the fault occurs in phase L2 or L3, the positive and negative sequence components should be phase-adjusted. This can be done based on the well-known theory of symmetrical components. Taken phase L1 as preference:

| L1: | $\underline{U}_2 = \underline{U}_2$ | $\underline{I}_2 = \underline{I}_2$ | $\underline{U}_1 = \underline{U}_1$ | $\underline{I}_1 = \underline{I}_1$ |
|---|---|---|---|---|
| L2: | $\underline{U}_2 = \underline{a} \cdot \underline{U}_2$ | $\underline{I}_2 = \underline{a} \cdot \underline{I}_2$ | $\underline{U}_1 = \underline{a}^2 \cdot \underline{U}_1$ | $\underline{I}_1 = \underline{a}^2 \cdot \underline{I}_1$ |
| L3: | $\underline{U}_2 = \underline{a}^2 \cdot \underline{U}_2$ | $\underline{I}_2 = \underline{a}^2 \cdot \underline{I}_2$ | $\underline{U}_1 = \underline{a} \cdot \underline{U}_1$ | $\underline{I}_1 = \underline{a} \cdot \underline{I}_1$ |

After the calculations, the resulting fault distance line has the following co-ordinates in a (d, s)-domain:

$$s=0, d=\{d(s=0)\} \quad \text{(Eq. 1)}$$

$$s=1, d=\{d(s=1)\}$$

In other words, the two endpoints of the fault distance line has the following co-ordinates in a (d,s)-domain: (d,s)=(d(s=0),0) and (d(s=1),1).

After the first fault distance line has been determined, the fault distance calculation proceeds by determining, when the ratio of the fault current and load current has a second value which differs from the first value, at least one second fault distance line which indicates an estimate of a distance of the fault from the measuring point in relation to the equivalent load distance on the basis of values of the monitored current and voltage quantities and an equation which relates the monitored current and voltage quantities to the fault distance. In other words, one or more second (additional) fault lines are determined in a similar manner as the first fault distance line described above but such that the ratio of the fault current and load current has a different value. If more than one second fault lines are determined, the ratio of the fault current and load current has preferably a different value each time. The change in the ratio of fault and load current magnitude can be achieved by changing the switching state of the electric network e.g. with some manual or automatic switching operations in the background network e.g. during the dead-time of a delayed auto-reclosing sequence. Such switching operations may also include changing the degree of earth fault current compensation in a system earthed through a Petersen coil.

Figure 4:
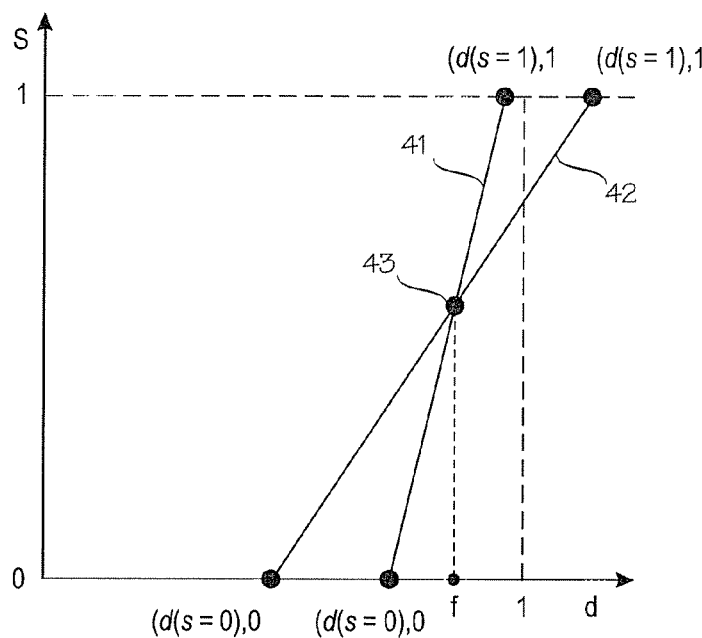
FIG. 4 is an example of fault distance lines according to an embodiment.

The determined fault distance lines can be plotted in the (d, s)-domain between the two co-ordinates obtained as illustrated in FIG. 4, which comprises two fault distance lines 41 and 42. The fault distance lines are thus superimposed in the (d, s)-domain. The intersection point 43 of these lines is located at fault distance d (i.e. the d-co-ordinate of the intersection point between fault distance lines) from the measuring point and can be determined.

According to an embodiment of invention, a distance (or distances) at which the determined fault distance lines intersect when superimposed is determined and the distance between the measuring point and the point of fault is then determined on the basis of the determined distance(s) of intersection.

According to an embodiment, one second fault distance line is determined and thus two fault distance lines 41 and 42 are obtained as shown in the example of FIG. 4. In this case, according to an embodiment, the distance from the measuring point at which the first fault distance line and the second fault distance line intersect is determined as the distance between the measuring point and the point of fault.

According to another embodiment, more than one second fault distance lines are determined and thus three or more fault distance lines are obtained. If the point of intersection of the different fault distance lines in this case is not the same point, e.g. due to various error sources, it is possible to obtain more than one intersection points. In this case, according to an embodiment, an average of the distances from the measuring point at which the determined fault distance lines intersect (an average of the d-co-ordinates of the intersection points) can be determined as the distance between the measuring point and the point of fault. The average may be a calculated average of the distances of the intersection points, for example. It is also possible to determine the average graphically. In case of several intersection points, it is also possible to determine the distance between the measuring point and the point of fault in some other manner on the basis of the intersection points without deviating from the basic idea of the invention. For example, some kind of graphical analysis could be used. Moreover, the more vertical a fault distance line is the more accurate it probably is. Thus, more emphasis could be given to intersection points of the most vertical fault distance lines than more tilted lines when determining the distance between the measuring point and the point of fault.

The intersection point(s) 43 between the fault distance lines can be found either by visual inspection from a figure or by calculation. The visual determination of the intersection point(s) and thus the distance between the measuring point and the point of fault can be made when the fault distance lines are represented graphically as exemplified in FIG. 4 where the intersection point 43 is projected on d-axis (point f in order to obtain the d-co-ordinate value of the intersection point 43. The calculation of the intersection point requires that the fault distance lines be represented with one or more equations. For example, by denoting:

for a first fault distance line: d(s=0)=ds0a and d(s=1)=ds1a; and for a second fault distance line: d(s=0)=ds0b and d(s=1)=ds1b, the d-co-ordinate value of the intersection point of the first and second fault distance lines can be obtained using the following equation:

$$d = \frac{-ds0b \cdot ds1a + ds0b \cdot ds0a + ds0a \cdot ds1b - ds0a + ds0b}{ds1b - ds0b - ds1a + ds0a} \quad \text{(Eq. 12)}$$

An apparatus implementing the method of the invention could only output the fault distance lines whereby the user of such apparatus would perform the actual determination of the distance between the measuring point and the point of fault on the basis of the outputted information. In this case the fault distance lines can be outputted to a display screen, a printer or memory means, for example. It should also be noted that the fault distance lines can be defined as continuous or discrete.

An apparatus according to an embodiment of the invention may be implemented such that it comprises a calculation unit which determines the fault distance lines as described above. Such a calculation unit may additionally be configured to determine the distance between the measuring point and the point of fault. The apparatus may further comprise a detection unit which detects a fault on the electric line and/or an identification unit, which identifies a faulted phase or phases of the electric line. Here the term 'unit' refers generally to a physical or logical entity, such as a physical device or a part thereof or a software routine. The other embodiments of the invention described above may be implemented e.g. with the calculation unit or one or more additional units. The above-mentioned detection, identification and calculation units and possible additional units may be physically separate units or implemented as one entity. One or more of these units may reside in the protective relay unit 40 of FIG. 1, for example. When the fault detection and/or identification of the faulted phase are performed by a separate unit or units which are possibly already present in the system to be protected, the invention can be implemented with an apparatus which receives the fault detection information and indication of the faulted phase from such units.

An apparatus according to any one of the embodiments of the invention can be implemented by means of a computer or corresponding digital signal processing equipment with suitable software therein, for example. Such a computer or digital signal processing equipment preferably comprises at least a memory providing storage area used for arithmetical operations and a processor, such as a general-purpose digital signal processor (DSP), for executing the arithmetical operations. It is also possible to use a specific integrated circuit or circuits, or corresponding components and devices for implementing the functionality according to any one of the embodiments of the invention.

The invention can be implemented in existing system elements, such as various protective relays or relay arrangements, in a distribution management system (DMS), or by using separate dedicated elements or devices in a centralized or distributed manner. Present protective devices for electric systems, such as protective relays, typically comprise processors and memory that can be utilized in the functions according to embodiments of the invention. Thus, all modifications and configurations required for implementing an embodiment of the invention e.g. in existing protective devices may be performed as software routines, which may be implemented as added or updated software routines. If the functionality of the invention is implemented by software, such software can be provided as a computer program product comprising computer program code which, when run on a computer, causes the computer or corresponding arrangement to perform the functionality according to the invention as described above. Such a computer program code can be stored on a computer readable medium, such as suitable memory means, e.g. a flash memory or a disc memory from which it is loadable to the unit or units executing the program code. In addition, such a computer program code implementing the invention can be loaded to the unit or units executing the computer program code via a suitable data network, for example, and it can replace or update a possibly existing program code.

It will be obvious to a person skilled in the art that, as the technology advances, the inventive concept can be implemented in various ways. The invention and its embodiments are not limited to the examples described above but may vary within the scope of the claims.

The invention claimed is:

1. A method for determining a location of a phase-to-earth fault on a three-phase electric line of an electric network, the method comprising:
monitoring current and voltage quantities of the three-phase electric line at a measuring point;
determining, after a fault occurs in the three-phase electric line and when the ratio of a fault current and load current has a first value, a first fault distance line which indicates an estimate of the distance of the fault from the measuring point in relation to an equivalent load distance on the basis of values of the monitored current and voltage quantities and an equation which relates the monitored current and voltage quantities to the fault distance, wherein the equivalent load distance indicates a distance of an equivalent load point from the measuring point which equivalent load point equals to a total load of the electric line modelled to be concentrated in a single point of the electric line;
determining, when the ratio of the fault current and load current has a second value which differs from the first value, at least one second fault distance line which indicates an estimate of the distance of the fault from the measuring point in relation to the equivalent load distance on the basis of values of the monitored current and voltage quantities and an equation which relates the monitored current and voltage quantities to the fault distance;
determining a distance or distances from the measuring point at which the determined fault distance lines intersect when superimposed; and
determining the distance between the measuring point and the point of fault on the basis of the determined distance or distances of intersection.

2. The method of claim 1, wherein one second fault distance line is determined.

3. The method of claim 2, wherein the distance from the measuring point at which the first fault distance line and the second fault distance line intersect is determined as the distance between the measuring point and the point of fault.

4. The method of claim 1, wherein more than one second fault distance lines are determined such that the ratio of the fault current and load current has a different value each time.

5. The method of claim 1, wherein an average of the distances from the measuring point at which the determined fault distance lines intersect is determined as the distance between the measuring point and the point of fault.

6. The method of claim 1, comprising varying the ratio of the fault current and load current by changing the switching state of the electric network.

7. The method of claim 1, wherein the fault distance lines are represented graphically.

8. The method of claim 7, wherein the determination of the distance at which the fault distance lines intersect is performed visually.

9. The method of claim 1, wherein the fault distance lines are represented by one or more equations.

10. A computer program product comprising computer program code, wherein the execution of the program code in a computer causes the computer to carry out the method of claim 1.

11. An apparatus for use in localization of a phase-to-earth fault on a three-phase electric line of an electric network, comprising:

a detector that monitors current and voltage quantities of the three-phase electric line at a measuring point;

a calculator that determines, after a fault occurs in the three-phase electric line and when the ratio of a fault current and load current has a first value, a first fault distance line which indicates an estimate of the distance of the fault from the measuring point in relation to an equivalent load distance on the basis of values of the monitored current and voltage quantities and an equation which relates the monitored current and voltage quantities to the fault distance, wherein the equivalent load distance indicates a distance of an equivalent load point from the measuring point which equivalent load point equals to a total load of the electric line modelled to be concentrated in a single point of the electric line, and determines, when the ratio of the fault current and the load current has a second value which differs from the first value, at least one second fault distance line which indicates an estimate of the distance of the fault from the measuring point in relation to the equivalent load distance on the basis of values of the monitored current and voltage quantities and an equation which relates the monitored current and voltage quantities to the fault distance.

12. The apparatus of claim 11, further comprising:
an identifier,
wherein the detector detects a fault on the three-phase electric line and the identifier identifies a faulted phase of the three-phase electric line.

13. The apparatus of claim 11 wherein calculator determines one second fault distance line.

14. The apparatus of claim 11 wherein the calculator determines more than one second fault distance lines such that the ratio of the fault current and load current has a different value each time.

15. The apparatus of claim 11, wherein the calculator
determines a distance or distances from the measuring point at which the determined fault distance lines intersect when superimposed; and
determines the distance between the measuring point and the point of fault on the basis of the determined distance or distances of intersection.

16. The apparatus of claim 13, wherein the calculator determines the distance from the measuring point at which the first fault distance line and the second fault distance line intersect as the distance between the measuring point and the point of fault.

17. The apparatus of claim 14, wherein the calculator determines an average of the distances from the measuring point at which the determined fault distance lines intersect as the distance between the measuring point and the point of fault.

18. The apparatus of claim 11, comprising:
an output that output the determined fault distance lines.

19. The apparatus of claim 18, wherein the output outputs the determined fault distance lines in a graphical form.

20. The apparatus of claim 18 wherein the output outputs the determined fault distance lines mutually superimposed.

21. The apparatus of claim 11, wherein the detector varies the ratio of the fault current and load current by changing the switching state of the electric network.

22. The apparatus of claim 11, wherein the apparatus is a protective relay.

23. An apparatus for use in localization of a phase-to-earth fault on a three-phase electric line of an electric network, the apparatus comprising:
means for monitoring current and voltage quantities of the three-phase electric line at a measuring point;
means for determining, after a fault occurs in the three-phase electric line and when the ratio of a fault current and a load current has a first value, a first fault distance line which indicates an estimate of the distance of the fault from the measuring point in relation to an equivalent load distance on the basis of values of the monitored current and voltage quantities and an equation which relates the monitored current and voltage quantities to the fault distance, wherein the equivalent load distance indicates a distance of an equivalent load point from the measuring point which equivalent load point equals to a total load of the electric line modeled to be concentrated in a single point of the electric line; and
means for determining, when the ratio of the fault current and the load current has a second value which differs from the first value, at least one second fault distance line which indicates an estimate of the distance of the fault from the measuring point in relation to the equivalent load distance on the basis of values of the monitored current and voltage quantities and an equation which relates the monitored current and voltage quantities to the fault distance.

* * * * *

UNITED STATES PATENT AND TRADEMARK OFFICE
CERTIFICATE OF CORRECTION

PATENT NO. : 7,999,557 B2
APPLICATION NO. : 12/122196
DATED : August 16, 2011
INVENTOR(S) : Ari Wahlroos et al.

Page 1 of 1

It is certified that error appears in the above-identified patent and that said Letters Patent is hereby corrected as shown below:

Title Page: Add item --(30) Foreign Application Priority Data, European Patent Application No. 07108461, filed on May 18, 2007.--

Signed and Sealed this
Fourth Day of September, 2012

David J. Kappos
*Director of the United States Patent and Trademark Office*